United States Patent [19]

Doshita

[11] Patent Number: 5,251,108
[45] Date of Patent: Oct. 5, 1993

[54] LAMINATED ELECTRONIC DEVICE WITH STAGGERED HOLES IN THE CONDUCTORS

[75] Inventor: Kazuyuki Doshita, Nagaokakyo, Japan

[73] Assignee: Murata Manufacturing Co., Ltd., Nagaokakyo, Japan

[21] Appl. No.: 827,596

[22] Filed: Jan. 29, 1992

[30] Foreign Application Priority Data

Jan. 30, 1991 [JP] Japan .................. 3-2488[U]

[51] Int. Cl.⁵ .................. H05K 1/11; H01F 27/28
[52] U.S. Cl. .................. 361/792; 336/200; 336/232; 361/728; 361/765; 361/777
[58] Field of Search .......... 333/174, 184; 336/200, 336/232; 361/392, 410, 409, 412, 414, 402

[56] References Cited

U.S. PATENT DOCUMENTS

| | | | |
|---|---|---|---|
| 3,504,276 | 3/1970 | Proctor et al. | 361/409 |
| 3,812,442 | 5/1974 | Muckelroy | 336/232 |
| 4,313,152 | 1/1982 | Vranken | 361/402 |
| 4,322,698 | 3/1982 | Takahashi et al. | 333/184 |
| 4,342,143 | 8/1982 | Jennings | 361/402 |
| 4,494,100 | 1/1985 | Stengel et al. | 336/200 |
| 4,543,553 | 9/1985 | Mandai et al. | 336/232 |
| 4,626,816 | 12/1986 | Blumkin et al. | 336/232 |
| 4,689,594 | 8/1987 | Kawabata et al. | 336/200 |
| 4,888,568 | 12/1989 | Kawaguchi | 333/174 |
| 4,899,118 | 2/1990 | Polinski, Sr. | 361/414 |
| 4,954,814 | 9/1990 | Benge | 361/402 |
| 5,032,815 | 7/1991 | Kobayashi et al. | 336/200 |
| 5,126,707 | 6/1992 | Ikeda | 336/200 |

FOREIGN PATENT DOCUMENTS

| | | | |
|---|---|---|---|
| 59-105304 | 6/1984 | Japan | 336/200 |
| 62-61305 | 3/1987 | Japan | 336/232 |
| 62-279622 | 4/1987 | Japan | 361/414 |

OTHER PUBLICATIONS

Basic Electronics Text Book 4th ed. by Bernard Grob. Copyright 1977 Published by Von Hoffman Press Inc.

Primary Examiner—Leo P. Picard
Assistant Examiner—Donald Sparks
Attorney, Agent, or Firm—Burns, Doane, Swecker & Mathis

[57] ABSTRACT

A laminated electronic device wherein internal conductors are connected electrically through through holes For each connection of the conductors, at least two through holes are formed for providing at least two connecting points. Also, the through holes are positioned staggeringly in respect to the internal conductor.

8 Claims, 2 Drawing Sheets

LAMINATED ELECTRONIC DEVICE WITH STAGGERED HOLES IN THE CONDUCTORS

BACKGROUND OF THE INVENTION

Field of the Invention

The present invention relates to a laminated electronic device such as a transformer, an LC filter, a common mode choke coil and a delay line device.

Description of Related Art

In a laminated electronic device which is formed by laminating base sheets which have conductors on their surfaces, each conductor is connected electrically through a through hole provided on the base sheet.

In the past, one through hole is provided on the base sheet for each electrical connection of the conductors. However, if the base sheets are not laminated correctly in the right position (if a mislamination of the base sheet is occurred), the through hole is not overlaid on a connecting portion of the conductor in the right position either, and this reduces a connecting area between the through hole and the conductor. In this case, if delamination of the base sheets is caused by deflection of the device, the connection between the through hole and the conductor may be cut, or resistance at the connecting area may increase. Furthermore, when the mislamination of the base sheets is major, the through hole and the conductor will not be in contact with each other and will not be connected electrically.

SUMMARY OF THE INVENTION

An object of the present invention is to provide a laminated electronic device which has high reliability on electrical connection between conductors.

In order to attain the object, a laminated electronic device according to the present invention comprises plural base sheets; a conductor provided on each of the base sheets; and at least two through holes for connecting the conductors electrically, said through holes being formed on each of the base sheets.

Since at least two through holes are formed on each base sheet, the connecting area of the conductors is increased compared with the conventional laminated electronic device. Also since at least two electrical connecting portion of the conductors are provided for each connection between the conductors, even if the base sheets are mislaminated, the electrical connection between the conductors is ensured.

In case that a coil is formed by connecting the conductors in series electrically through the through holes, a reliability of electrical connection is increased.

A more reliable way of preventing failure in the electrical connection between the conductors resulting from the mislamination of the base sheets is arranging the through holes staggeringly in respect to the respective conductors.

BRIEF DESCRIPTION OF THE DRAWINGS

This and other objects and features of the present invention will become apparent from the following description taken in conjunction with the preferred embodiments thereof with reference to the accompanying drawings, in which.

DETAILED DESCRIPTION OF THE PREFERRED EMBODIMENTS

Figure 1:
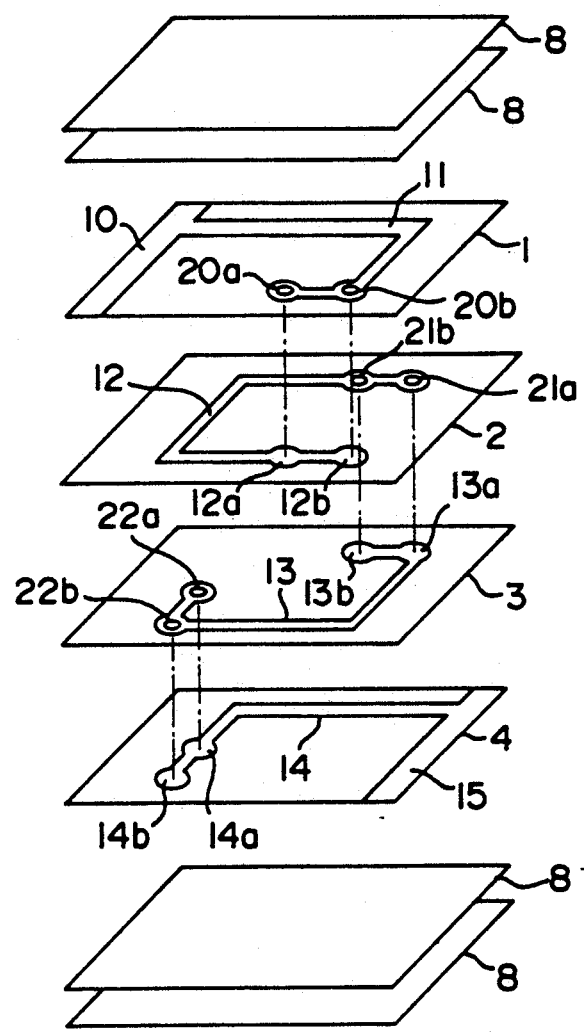
FIG. 1 is an exploded perspective view of a laminated electronic device which is a first embodiment of the present invention.

The description of preferred embodiments according to the present invention is given below, referring to the drawings.

Figure 2:
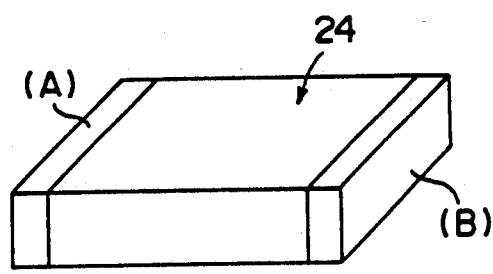
FIG. 2 is a perspective view which shows an appearance of the laminated electronic device shown in FIG. 1.

First Embodiment: FIGS. 1 and 2

FIG. 1 is an exploded perspective view of a chip inductor 24 which has two terminals. Base sheets 1, 2, 3 and 4 and protective base sheets 8 are rectangular and made of a magnetic material such as ferrite. On the base sheet 1, a leading electrode 10 and a coil conductor 11 which are made of a conductive paste such as silver and a mixture of silver and palladium by printing or the like. The leading electrode 10 is exposed at a left edge of the base sheet 1 and the coil conductor 11 is connected with the leading electrode 10. Two through holes 20a and 20b which are formed on the base sheet 1 are located at the other end of the conductor 11.

A coil conductor 12 made of the conductive paste is formed on the base sheet 2. Two through holes 21a and 21b are formed at an end of the conductor 12. At the other end of the conductor 12, two connecting portions 12a and 12b which have a large connecting area are formed. In the same process as the base sheet 2; coil conductors 13 and 14 are formed on the base sheets 3 and 4 respectively. Two through holes 22a and 22b are formed at an end of the conductor 13, and connecting portions 13a and 13b are formed at the other end. An end of the conductor 14 is connected with a leading electrode 15, and connecting parts 14a and 14b are formed at the other end of the conductor 14.

The base sheets 1-4 which are prepared in the above process are laminated and then plural protective base sheets 8 are further laminated to the laminate of the sheets 1-4 on its upper and lower surfaces. After the lamination, the two through holes 20a and 20b formed at the conductor 11 are overlaid respectively on the connecting portions 12a and 12b formed at the conductor 12. Therefore, the conductors 11 and 12 are connected electrically in series at two connecting points through the through holes 20a and 20b. Also, the two through holes 21a and 21b formed at the conductor 12 are overlaid on the connecting portions 13a and 13b formed at the conductor 13 respectively, and the conductors 12 and 13 are connected electrically at the two connecting points through the through holes 21a and 21b. In the same process as explained above, the conductors 13 and 14 are connected electrically through the through holes 22a and 22b.

In the above process, a coil is formed between the leading electrodes 10 and 15. Connecting areas of the through holes 20a–22b and the conductors 11–14 are increased compared with the conventional laminated electronic device. Therefore even if the base sheets 1–4 are not laminated correctly, the chip inductor 24 can work normally as long as one of the two through holes on each sheet is connected electrically with a conductor. For example, as long as one of the through holes 20a and 21b is in contact with the conductor 12, electrical connection between the conductors 11 and 12 is guaranteed. Consequently, the chip inductor 24 which has high reliability of electrical connection between the conductors 11-14 can be obtained.

As shown in FIG. 2, the chip inductor 24 is covered with the conductive paste of silver, a mixture of silver and palladium, or the like at both sides, and the conductive paste is connected with the leading electrodes 10 and 15. The conductive paste is baked to form external electrodes (A) and (B).

Figure 3:
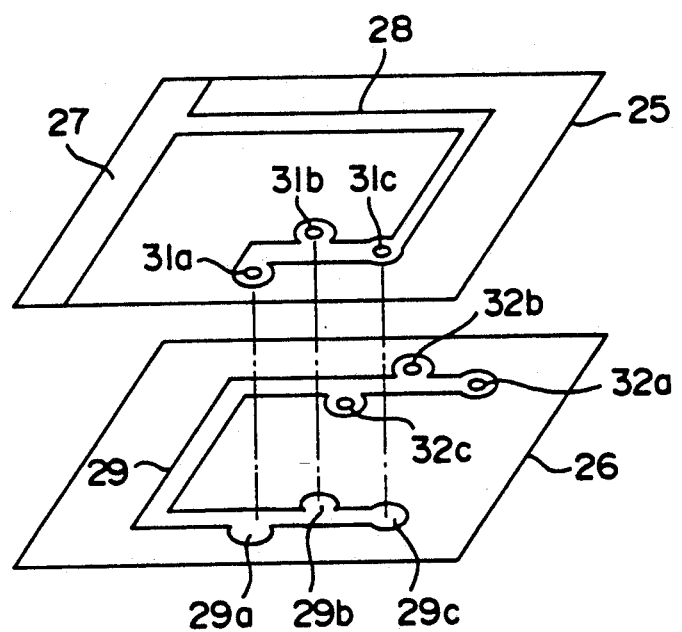
FIG. 3 is a fragmentary exploded perspective view of a laminated electronic device which is a second embodiment of the present invention.

Second embodiment: FIG. 3

FIG. 3 is an exploded perspective view of a part of another chip inductor. A leading electrode 27 and a coil conductor 28 which is connected with the leading electrode 27 are formed on a base sheet 25. At an end of the conductor 28, three through holes 31a, 31b and 31c are formed staggeringly. A coil conductor 29 is formed on a base sheet 26. At an end of the conductor 29, three through holes 32a, 32b and 32c are formed staggeringly, and connecting portions 29a, 29b, 29c which have large connecting area are formed at the other end.

When the base sheets 25 and 26 are laminated, the three through holes 31a, 31b and 31c are overlaid on the connecting portions 29a, 29b and 29c respectively. Since the through holes 31a, 31b and 31c are positioned staggeringly, higher reliability of electrical connection between the conductors 28 and 29 is ensured.

Other embodiments

Although the present invention has been described in connection with the preferred embodiments above, it is to be noted that various changes and modifications are apparent to a person skilled in the art. Such changes and modifications are to be understood as being within the scope of the present invention defined by the appended claims.

The present invention is not limited to chip inductors. The present invention can be applied to other electronic devices, for example, an LC filter comprising a coil and a capacitor.

The number of through holes which are formed to connect conductors can be more than three, and positioning of these through holes is arbitrary.

The base sheets are not limited to the magnetic material such as ferrite, and an insulating material such as dielectric can also be used.

What is claimed is:

1. A laminated electronic device comprising:
   plural base sheets which are laminated;
   a conductor provided on each of the base sheets; and
   at least two through-holes in the conductor on each of the base sheets for connecting the conductors electrically, said at least two through-holes being formed in a staggered relationship along the conductor on each of the base sheets.

2. A laminated electronic device as claimed in claim 1, wherein a coil is formed by connecting the conductors electrically in series through the through-holes.

3. A laminated electronic device comprising:
   plural base sheets which are laminated;
   a first conductor and a second conductor provided on each of a first base sheet and a second base sheet, respectively; and
   at least two through-holes in the first conductor of said first base sheet for electrically connecting the first conductor with the second conductor, said at least two through-holes being formed in a staggered relationship along the first conductor.

4. A laminated electronic device as claimed in claim 3, wherein a coil is formed by electrically connecting the conductors located on a plurality of said base sheets in series using the through-holes.

5. A laminated electronic device as claimed in claim 3, wherein said second base sheet further includes:
   two connecting portions formed in said second conductor having diameters which exceed a diameter of remaining portions of the second conductor, said two connecting portions being aligned with the two through-holes of said first conductor when said first and second base sheets are laminated to one another.

6. A laminated electronic device as claimed in claim 5, further including:
   protective base sheets made of a magnetic material and being laminated to a side of said first base sheet opposite a side of said first base sheet to which said second base sheet is laminated.

7. A laminated electronic device as claimed in claim 6, wherein the conductors formed on said first and second base sheets are serially connected to form a coil structure, said through-holes being located at a midpoint of the coil structure formed on the first and second base sheets when said first and second base sheets are laminated to one another.

8. A laminated electronic device as claimed in claim 7, further including:
   a conductive paste covering said laminated electronic device so as to expose lead electrodes at opposite ends of said coil structure.

* * * * *